United States Patent
Tamaki (10) Patent No.: US 12,213,380 B2
(45) Date of Patent: Jan. 28, 2025

(54) THERMOELECTRIC POWER GENERATION SYSTEM AND CONTROL METHOD THEREFOR

(71) Applicant: Panasonic Intellectual Property Management Co., Ltd., Osaka (JP)

(72) Inventor: Hiromasa Tamaki, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 8 days.

(21) Appl. No.: 18/057,926

(22) Filed: Nov. 22, 2022

(65) Prior Publication Data

US 2023/0090781 A1    Mar. 23, 2023

Related U.S. Application Data

(63) Continuation of application No. PCT/JP2021/020536, filed on May 28, 2021.

(30) Foreign Application Priority Data

Jun. 16, 2020 (JP) .................. 2020-103529

(51) Int. Cl.
  *H10N 10/17* (2023.01)
  *F01N 5/02* (2006.01)
  *H10N 10/13* (2023.01)

(52) U.S. Cl.
  CPC .......... *H10N 10/17* (2023.02); *F01N 5/025* (2013.01); *H10N 10/13* (2023.02)

(58) Field of Classification Search
  CPC ........ H10N 10/13; H10N 10/17; F01N 5/025
  See application file for complete search history.

(56) References Cited

U.S. PATENT DOCUMENTS

2005/0198983 A1*  9/2005  Bruzzo ............... F25B 25/005
                                                  62/238.3
2008/0098972 A1*  5/2008  Elwart .................. B60K 6/24
                                                  123/46 E
(Continued)

FOREIGN PATENT DOCUMENTS

DE   10 2008 005 334    7/2009
JP   2006-034046        2/2006
(Continued)

OTHER PUBLICATIONS

Extended European Search Report issued Sep. 28, 2023 in connection with European Application No. 21826079.2.
(Continued)

*Primary Examiner* — Lindsey A Buck
(74) *Attorney, Agent, or Firm* — Wenderoth, Lind & Ponack, L.L.P.

(57) ABSTRACT

A thermoelectric power generation system includes a first flow path for a first fluid, a second flow path for a second fluid, a temperature of the second fluid being lower than a temperature of the first fluid, a thermoelectric module between the first flow path and the second flow path, and a controller configured to switch between a power generation mode and a heating mode. In the power generation mode, the thermoelectric module is caused to generate electric power, based on a difference between the temperature of the first fluid and the temperature of the second fluid. In the heating mode, a first surface of the thermoelectric module is heated using a Peltier effect caused by supplying electric power to the thermoelectric module. A distance between the first surface and the first flow path is shorter than a distance between the first surface and the second flow path.

19 Claims, 5 Drawing Sheets

(56) References Cited

U.S. PATENT DOCUMENTS

| | | | | |
|---|---|---|---|---|
| 2011/0308560 A1* | 12/2011 | Arbuckle | ............... | H10N 10/13 60/320 |
| 2015/0083180 A1* | 3/2015 | Lang | ..................... | H10N 10/13 136/207 |
| 2020/0018214 A1 | 1/2020 | Han et al. | | |

FOREIGN PATENT DOCUMENTS

| | | |
|---|---|---|
| JP | 2018-062909 | 4/2018 |
| JP | 2019-074003 | 5/2019 |

OTHER PUBLICATIONS

International Search Report of PCT application No. PCT/JP2021/020536 dated Aug. 17, 2021.

\* cited by examiner

THERMOELECTRIC POWER GENERATION SYSTEM AND CONTROL METHOD THEREFOR

BACKGROUND

1. Technical Field

The present disclosure relates to a thermoelectric power generation system that converts heat into electric power and a control method therefor.

2. Description of the Related Art

A thermoelectric conversion element is a type of thermoelectric element that can convert heat into electric power, electric power into heat, or both heat into electric power and electric power into heat. A thermoelectric conversion element is composed of, for example, a thermoelectric material exhibiting the Seebeck effect. In this case, the thermoelectric conversion element can convert a temperature difference between a heat source and a heat sink into electric power and is also called a thermoelectric generator.

By using such a thermoelectric conversion element, thermal energy that would have otherwise been released into the ambient environment without being used (for example, thermal energy from, for example, steam, heated water, or exhaust gas) can be collected and used efficiently. For example, in Japanese Unexamined Patent Application Publication No. 2019-074003, there is disclosed an exhaust system that collects heat of exhaust gas from an engine and generates electric power.

SUMMARY

However, with the existing technology described above, thermoelectric power generation efficiency decreases with use.

One non-limiting and exemplary embodiment provides a thermoelectric power generation system that can suppress a reduction in thermoelectric power generation efficiency that occurs with use and a control method therefor.

In one general aspect, the techniques disclosed here feature a thermoelectric power generation system including a first flow path along which a first fluid flows, a second flow path along which a second fluid having a lower temperature than the first fluid flows, a thermoelectric module arranged between the first flow path and the second flow path, and a controller that switches between a power generation mode, in which the thermoelectric module is caused to generate electric power based on a difference between a temperature of the first fluid and a temperature of the second fluid, and a heating mode, in which a first surface of the thermoelectric module is heated using the Peltier effect caused by supplying electric power to the thermoelectric module. A distance between the first surface and the first flow path is shorter than a distance between the first surface and the second flow path.

According to the present disclosure, a reduction in thermoelectric power generation efficiency that occurs with use can be suppressed. Further advantages and effects according to an aspect of the present disclosure will be clear from the specification and the drawings. Such advantages, effects, or both the advantages and effects are each provided by characteristics described in some embodiments as well as the specification and the drawings; however, all of the embodiments, the specification, and the drawings do not always have to be provided to obtain one or more of the characteristics.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTIONS (Underlying Knowledge Forming Basis of the Present Disclosure)

As described above, a thermoelectric conversion element can convert a temperature difference into electric power using the Seebeck effect. The present inventor found that a material contained in a high temperature fluid used as a heat source adheres from the high temperature fluid to a heat transfer surface of a thermoelectric conversion element, and the material adhered to the heat transfer surface reduces thermoelectric power generation efficiency.

Thus, the present disclosure provides a thermoelectric power generation system that can suppress a reduction in thermoelectric power generation efficiency that occurs with use by eliminating the material adhered to the heat transfer surface and a control method therefor.

In the following, embodiments will be described with reference to the drawings.

Note that any one of embodiments to be described below is intended to represent a general or specific example. Numerical values, shapes, materials, constituent elements, arrangement positions and connection forms of the constituent elements, steps, and the order of steps described in the following embodiments are examples, and are not intended to limit the scope of the claims.

Each drawing is not necessarily precisely illustrated. In each drawing, substantially the same or similar configurations are denoted by the same reference signs, and redundant description is omitted or simplified.

In the following, terms representing relationships between elements such as parallel and perpendicular, terms representing shapes of elements such as rectangular, and ranges of numerical values not only present only strict meanings but also cover substantially the same ranges such as ranges containing differences on the order of a few percentages.

(First Embodiment)

A first embodiment will be described. In the present embodiment, a first gas discharged from an internal combustion engine (ICE) (hereinafter referred to as exhaust gas) is used as a high temperature fluid.

[1.1 Configuration of Thermoelectric Power Generation System 10 and Vehicle or Ship 1]

[1.1.1 Configuration of Vehicle or Ship 1]

Figure 1:
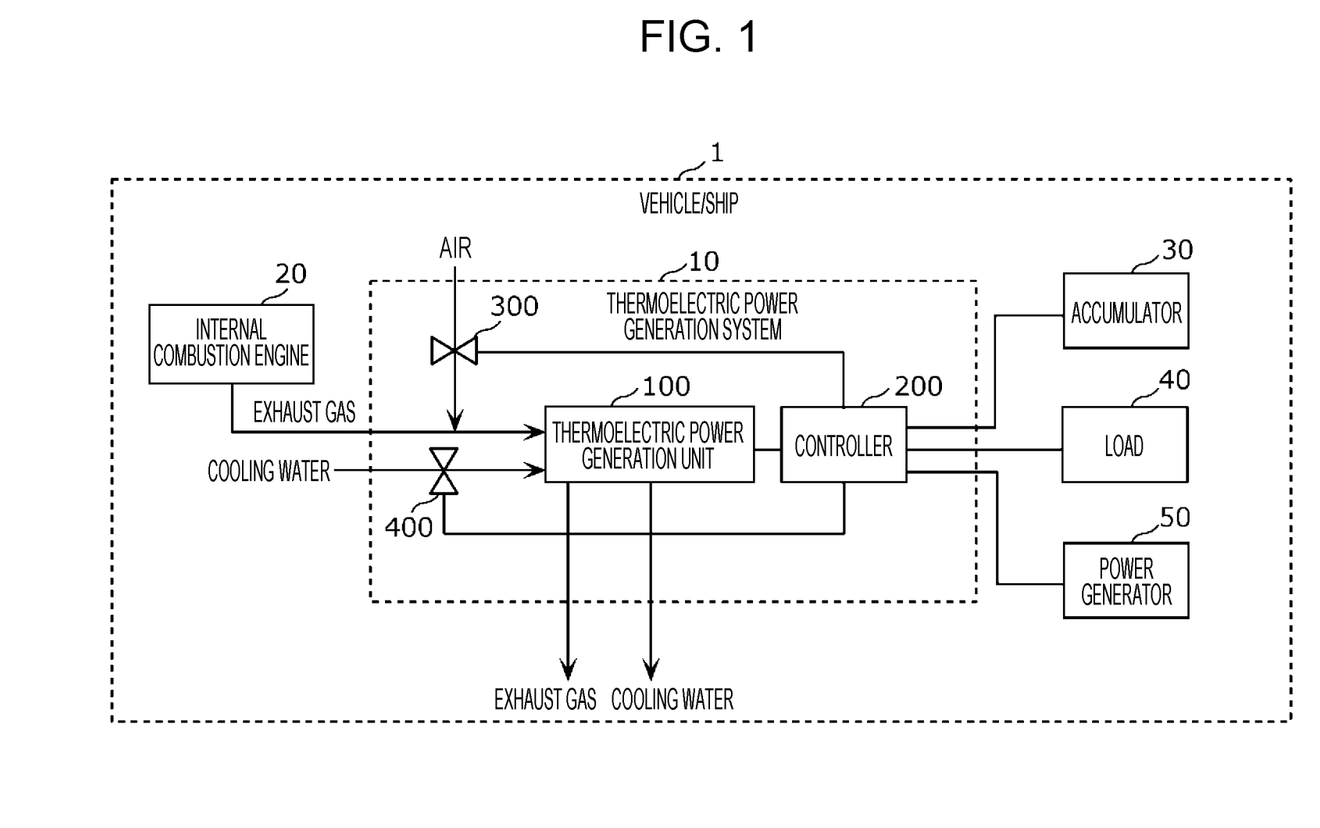
FIG. 1 is a block diagram illustrating a functional configuration of a vehicle or a ship equipped with a thermoelectric power generation system according to a first embodiment.

First, the configuration of a vehicle or ship 1 equipped with a thermoelectric power generation system 10 will be described with reference to FIG. 1. FIG. 1 is a block diagram illustrating a functional configuration of the vehicle or ship 1 equipped with the thermoelectric power generation system 10 according to the first embodiment.

Vehicles are conveyances that have one or more wheels and travel on land. Ships are conveyances that sail on water. As illustrated in FIG. 1, the vehicle or ship 1 includes the thermoelectric power generation system 10, an internal combustion engine 20, an accumulator 30, a load 40, and a power generator 50.

The internal combustion engine 20 is a motor that obtains mechanical energy using gas generated by burning fuel and is also simply called an engine. Exhaust gas from the internal combustion engine 20 contains soot produced by incomplete fuel combustion.

The thermoelectric power generation system 10 generates electric power using exhaust gas from the internal combustion engine 20. Details of the thermoelectric power generation system 10 will be described later.

The accumulator 30 stores electric power generated by a thermoelectric power generation unit 100, the power generator 50, or both the thermoelectric power generation unit 100 and the power generator 50 and supplies electric power to the thermoelectric power generation unit 100, the load 40, or both the thermoelectric power generation unit 100 and the load 40. As the accumulator 30, for example, an accumulator battery (a secondary battery), a capacitor, or the like can be used.

The load 40 consumes electric power generated by the thermoelectric power generation system 10, electric power stored in the accumulator 30, or electric power generated by the power generator 50. As the load 40, for example, an electric motor used to start an air conditioner, a headlight, or the internal combustion engine 20, an electric motor used to drive or sail the vehicle or ship 1, or the like can be used.

The power generator 50 converts mechanical energy generated by the internal combustion engine 20 into electrical energy. As the power generator 50, for example, an electric motor can be used, which can also be shared with the load 40. As the power generator 50, for example, an alternator, a dynamo, or the like can also be used.

[1.1.2 Configuration of Thermoelectric Power Generation System 10]

Next, the configuration of the thermoelectric power generation system 10 will be described with reference to FIG. 1. As illustrated in FIG. 1, the thermoelectric power generation system 10 includes the thermoelectric power generation unit 100, a controller 200, a first valve 300, and a second valve 400.

The thermoelectric power generation unit 100 converts a temperature difference between a high temperature fluid and a low temperature fluid into electric power. The high temperature fluid corresponds to a first fluid, and the low temperature fluid corresponds to a second fluid having a lower temperature than the first fluid. Exhaust gas from the internal combustion engine 20 flows as the high temperature fluid into the thermoelectric power generation unit 100 and passes through the thermoelectric power generation unit 100. The low temperature fluid flows into and passes through the thermoelectric power generation unit 100.

The controller 200 switches between a power generation mode and a heating mode. The controller 200 is realized by, for example, an integrated circuit. The controller 200 may also be realized by a processor and a memory. In this case, when an instruction or a software program stored in the memory is executed, the processor functions as the controller 200.

The power generation mode is a mode in which a thermoelectric module is caused to generate electric power using the temperature difference between the high temperature fluid and the low temperature fluid. In the power generation mode, electric power is converted from the temperature difference between the high temperature fluid and the low temperature fluid by using the Seebeck effect, and the controller 200 causes the accumulator 30 to store the electric power or causes the load 40 to consume the electric power.

The heating mode is a mode in which a first surface of the thermoelectric module is heated, the first surface being connected to a high temperature fluid flow path. In the heating mode, the controller 200 supplies electric power from the accumulator 30 or the power generator 50 to the thermoelectric power generation unit 100 and consequently heats up the first surface of the thermoelectric module connected to the high temperature fluid flow path by using the Peltier effect or a synergistic effect created by the Peltier effect and the Joule heating effect caused by energization. "Member A is connected to member B" may refer to a case where member A is directly connected to member B or a case where member A is indirectly connected to member B. "Member A is directly connected to member B" may refer to a case where there is no other member between member A and member B. "Member A is indirectly connected to member B" may refer to a case where there is one or more members between member A and member B.

In such a power generation mode and a heating mode, the controller 200 controls a voltage to be applied to the thermoelectric power generation unit 100 such that the thermoelectric power generation unit 100 is operated at a voltage value and a current value suitable for power generation or heating. Furthermore, the controller 200 controls a voltage to be applied to the accumulator 30 such that the accumulator 30 is operated at a voltage value and a current value suitable for charging or discharging.

The first valve 300 is an example of a first flow rate controller, and is a flow rate control valve that controls the inflow rate of air into the thermoelectric power generation unit 100. The first valve 300 is controlled by the controller 200. For example, by controlling the first valve 300, the controller 200 increases the inflow rate of air in the heating mode in comparison with the inflow rate in the power generation mode.

In this case, air is an example of a second gas, and is a gas having a higher oxygen concentration than exhaust gas. Thus, air can promote combustion of soot adhered to the thermoelectric power generation unit 100. Note that the second gas is not limited to air, and any gas may be used as long as the gas has a higher oxygen concentration than exhaust gas and does not prevent soot from burning.

The second valve 400 is an example of a second flow rate controller, and is a flow rate control valve that controls the inflow rate of the low temperature fluid into the thermoelectric power generation unit 100. The second valve 400 is controlled by the controller 200. For example, the controller 200 controls the second valve 400 in accordance with the temperature of the low temperature fluid flowing out from the thermoelectric power generation unit 100. Specifically, the controller 200 increases the inflow rate of the low temperature fluid in a case where the temperature of the low temperature fluid is greater than or equal to a first predetermined threshold temperature, for example, by controlling the second valve 400. In contrast, the controller 200 may reduce the inflow rate of the low temperature fluid in a case where the temperature of the low temperature fluid is less than a second predetermined threshold temperature. The first predetermined threshold temperature and the second predetermined threshold temperature may be equal to each other or different from each other. As the first predetermined threshold temperature and the second predetermined threshold temperature, temperatures predetermined empirically, experimentally, or empirically and experimentally can be used. The temperature of the low temperature fluid can be acquired by, for example, a temperature sensor arranged at a low temperature fluid outlet of the thermoelectric power generation unit 100.

Note that the first flow rate controller and the second flow rate controller are not limited to valves. For example, a fan and a pump can be used as the first flow rate controller, the second flow rate controller, or both the first flow rate controller and the second flow rate controller. The thermoelectric power generation system 10 does not have to include the first flow rate controller, the second flow rate controller, or both the first flow rate controller and the second flow rate controller.

[1.1.3 Configuration of Thermoelectric Power Generation Unit 100]

Figure 2:
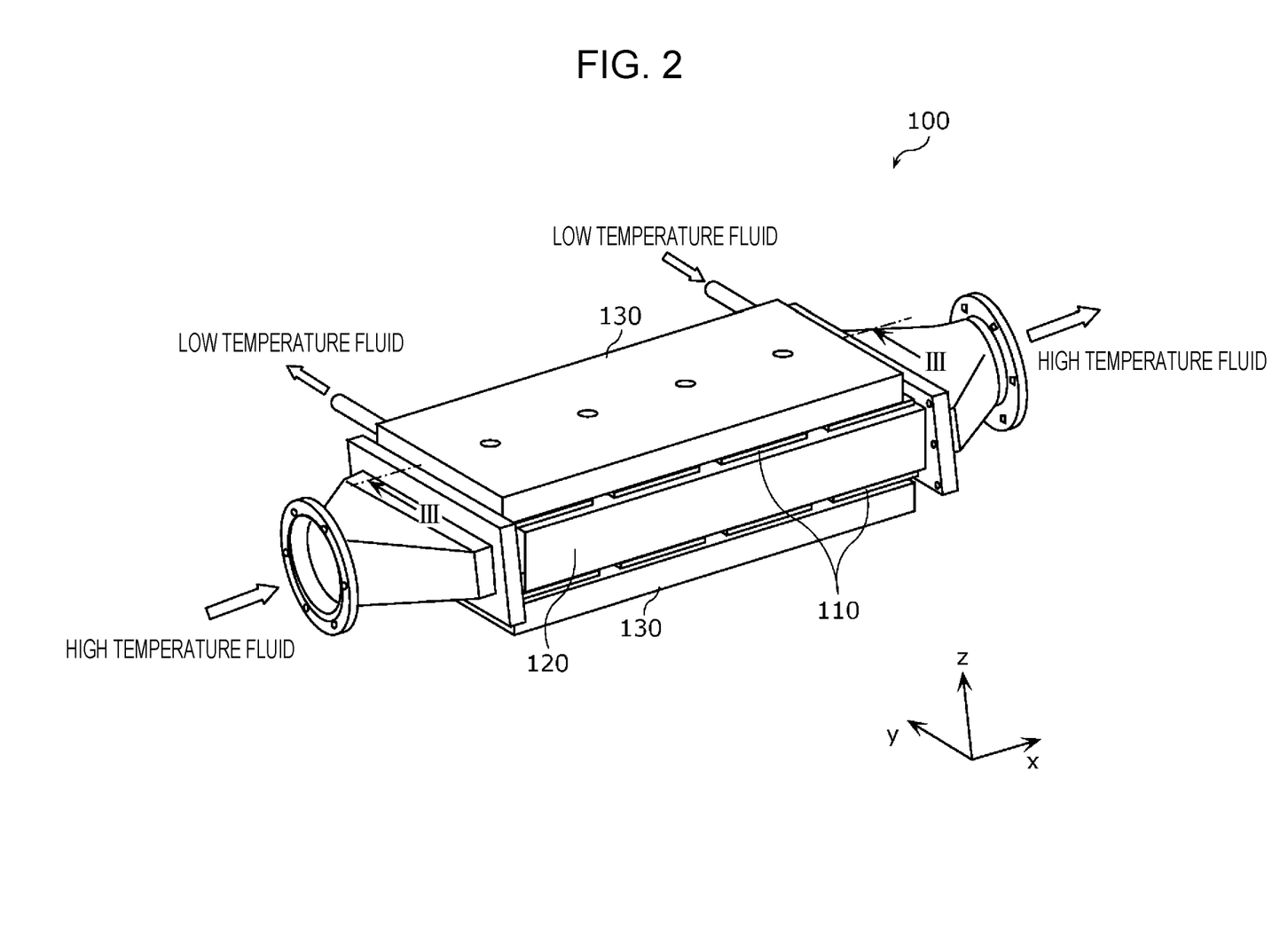
FIG. 2 is a perspective view of a thermoelectric power generation unit according to the first embodiment.
Figure 3:
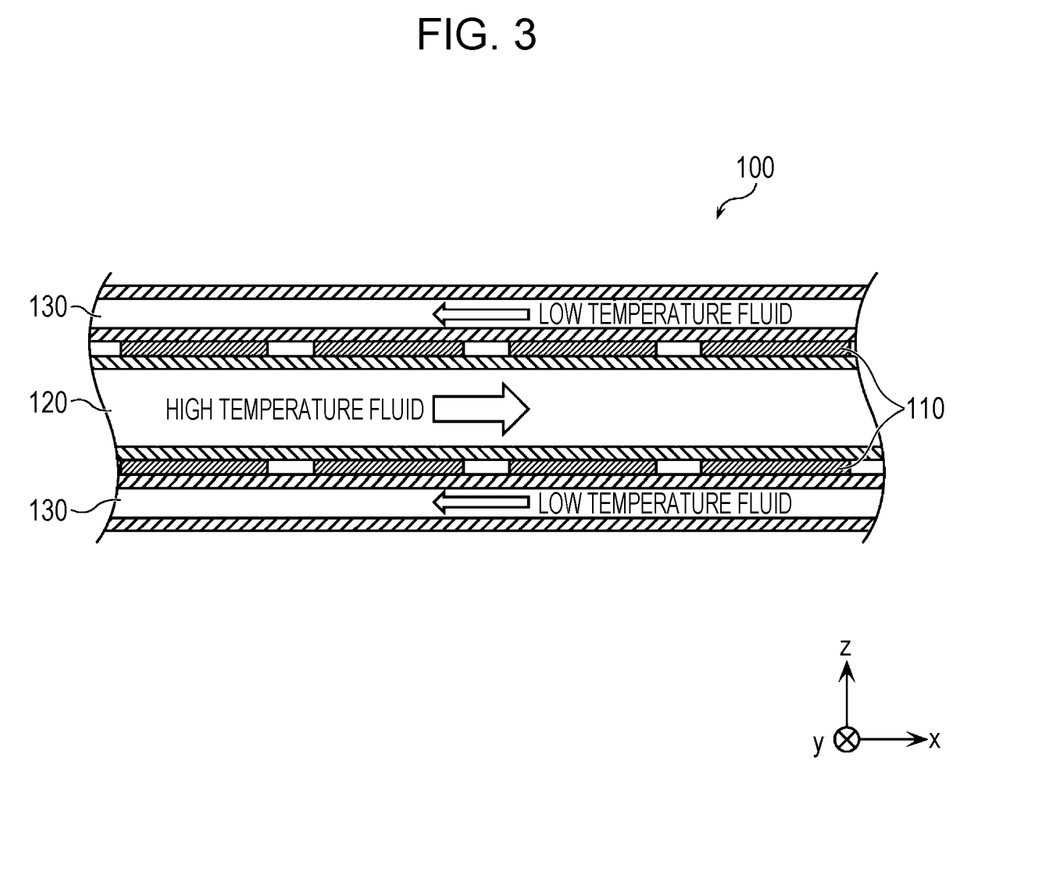
FIG. 3 is a cross sectional view of the thermoelectric power generation unit according to the first embodiment.

In the following, the configuration of the thermoelectric power generation unit 100 included in the thermoelectric power generation system 10 will be described with reference to FIGS. 2 and 3. FIG. 2 is a perspective view of the thermoelectric power generation unit 100 according to the first embodiment. FIG. 3 is a cross sectional view of the thermoelectric power generation unit 100 according to the first embodiment. The cross section of the thermoelectric power generation unit 100 in FIG. 3 corresponds to the cross section taken along line III-III in FIG. 2. As illustrated in FIGS. 2 and 3, the thermoelectric power generation unit 100 includes a thermoelectric module 110, a high temperature fluid flow path 120, and a low temperature fluid flow path 130. FIG. 2 illustrates two thermoelectric modules 110 and two low temperature fluid flow paths 130. The number of thermoelectric modules 110 may be one. The number of low temperature fluid flow paths 130 may be one.

The thermoelectric modules 110 have a flat plate like shape, and are each disposed between the high temperature fluid flow path 120 and a corresponding one of the low temperature fluid flow paths 130. By being arranged in this manner, a temperature difference occurs in the thickness direction of the thermoelectric module 110 (the z axis direction). The detailed configuration of the thermoelectric module 110 will be described later using FIG. 4.

The high temperature fluid flow path 120 is an example of a first flow path along which the high temperature fluid flows, and is arranged so as to be connected to the first surface of the thermoelectric module 110. The high temperature fluid flow path 120 is thermally connected to the first surface.

As described above, in the present embodiment, exhaust gas containing soot is used as the high temperature fluid. Thus, as a result of exhaust gas flowing along the high temperature fluid flow path 120, soot adheres to the inner surface of the high temperature fluid flow path 120. Soot adhered to the inner surface of the high temperature fluid flow path 120 has thermal resistance, thereby reducing the amount of heat transferred from the high temperature fluid to the thermoelectric module 110. As a result, the thermoelectric power generation efficiency of the thermoelectric power generation unit 100 decreases.

For this reason, the inner surface of the high temperature fluid flow path 120 is heated in the heating mode. Consequently, soot adhered to the inner surface of the high temperature fluid flow path 120 burns. As a result, soot is eliminated from the inner surface of the high temperature fluid flow path 120, and the thermoelectric power generation efficiency of the thermoelectric power generation unit 100 is restored.

Note that a catalyst for promoting combustion of soot may be applied onto the inner surface of the high temperature fluid flow path 120. As the catalyst, for example, precious metal, transition metal oxides, or the like can be used.

The low temperature fluid flow path 130 is an example of a second flow path along which the low temperature fluid flows, and is arranged so as to be connected to a second surface of the thermoelectric module 110. The low temperature fluid flow path 130 is thermally connected to the second surface. As the low temperature fluid, for example, water, air, or the like can be used; however, the low temperature fluid is not limited thereto.

Note that, in the present disclosure, the inner structures of the high temperature fluid flow path 120 and the low temperature fluid flow path 130 are not particularly limited. For example, fins may be provided in the high temperature fluid flow path 120 and the low temperature fluid flow path 130 to improve heat transfer performance. In this case, as the shapes of the fins, for example, a plate shape, a pin shape, a comb shape, or the like can be used.

[1.1.4 Configuration of Thermoelectric Module 110]

Figure 4:
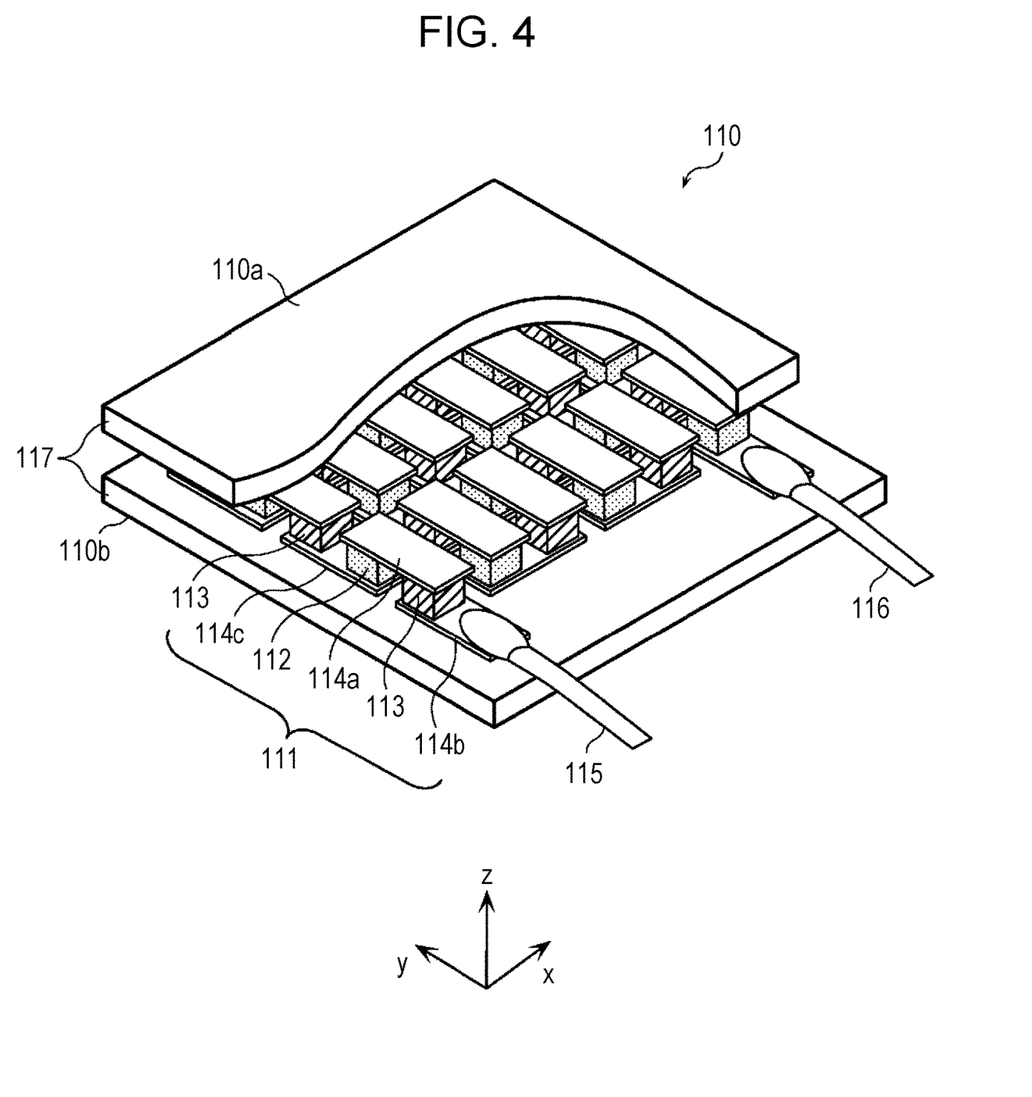
FIG. 4 is a perspective view of a thermoelectric module according to the first embodiment.

Next, the configuration of the thermoelectric module 110 included in the thermoelectric power generation unit 100 will be described with reference to FIG. 4. FIG. 4 is a perspective view of the thermoelectric module 110 according to the first embodiment. As illustrated in FIG. 4, the thermoelectric module 110 includes thermoelectric conversion elements 111 and two electric insulating plates 117.

The two electric insulating plates 117 form a surface 110*a* of the thermoelectric module 110 and a surface 110*b* on the opposite side to the surface 110*a*. The surface 110*a* is an example of the first surface, and is connected to the high temperature fluid flow path 120. The surface 110*b* is an example of the second surface, and is connected to the low temperature fluid flow path 130. As the electric insulating plates 117, for example, ceramic plates can be used; however, the electric insulating plates 117 are not limited thereto.

Each of the thermoelectric conversion elements 111 includes two different types of thermoelectric materials 112 and 113 and electrodes 114*a* to 114*c*. As the thermoelectric materials 112 and 113, for example, a p-type semiconductor and an n-type semiconductor can be used, in which the electrical polarities of the carriers are different from each other. Note that the thermoelectric materials 112 and 113 are not limited to a p-type semiconductor and an n-type semiconductor.

The ends of the thermoelectric materials 112 and 113 are each connected to an end of a thermoelectric material of a different type or a lead 115 or 116. For example, in FIG. 4, the top ends of the thermoelectric materials 112 and 113 are connected to each other via the electrode 114a. The bottom end of the thermoelectric material 112 is connected via the electrode 114c to the bottom end of the thermoelectric material 113 included in an adjacent thermoelectric conversion element 111. The bottom end of the thermoelectric material 113 is connected via the electrode 114b to the lead 115. The structure of the thermoelectric module 110, in which the thermoelectric conversion elements 111 are connected in this manner, is called a π type structure. In the π type structure, two different types of thermoelectric materials are electrically connected in series and thermally connected in parallel.

The thermoelectric module 110 configured in this manner can convert, using the Seebeck effect, a temperature difference between the high temperature fluid flowing along the flow path connected to the surface 110a and the low temperature fluid flowing along the flow path connected to the surface 110b into electrical power. In this case, the thermoelectric module 110 supplies electric power via the leads 115 and 116.

The thermoelectric module 110 can absorb heat through the surface 110b and discharge heat through the surface 110a using the Peltier effect. Furthermore, the thermoelectric module 110 can generate heat using the Joule heating effect caused by energization. As a result, the surface 110a is heated. In this case, the thermoelectric module 110 consumes electric power received via the leads 115 and 116.

[1.2 Processing performed by Thermoelectric Power Generation System 10]

Figure 5:
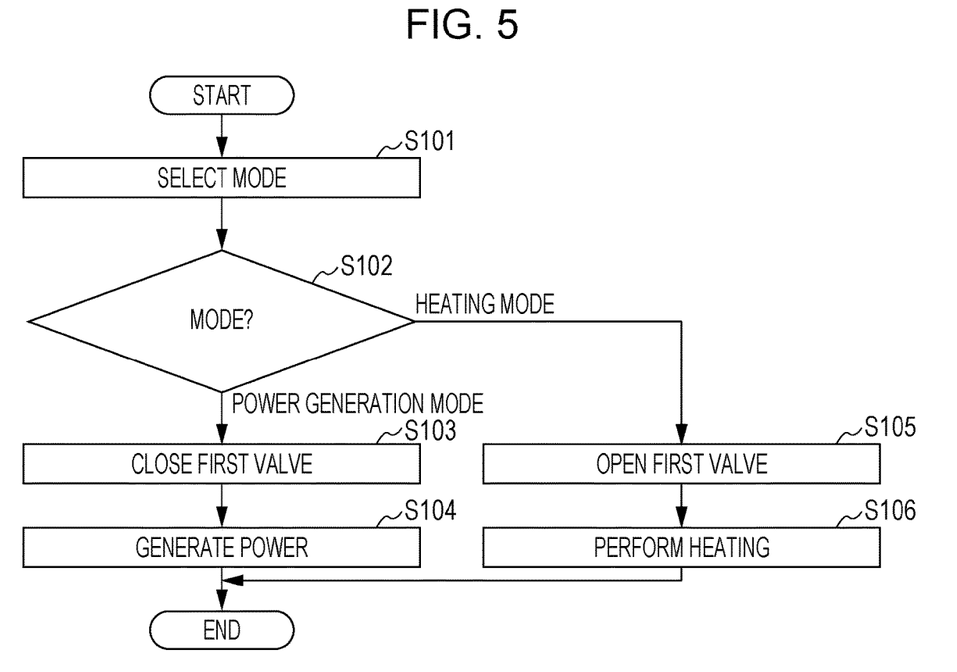
FIG. 5 is a flow chart illustrating processing performed by a controller of the thermoelectric power generation system according to the first embodiment.

Next, processing performed by the controller 200 of the thermoelectric power generation system 10 configured as described above will be described with reference to FIG. 5. FIG. 5 is a flow chart illustrating processing performed by the controller 200 of the thermoelectric power generation system 10 according to the first embodiment. That is, FIG. 5 illustrates a method for controlling the thermoelectric power generation system 10.

First, the controller 200 selects a mode (S101). Specifically, the controller 200 selects one out of the power generation mode and the heating mode. That is, the controller 200 switches between the power generation mode and the heating mode.

For example, the controller 200 may select the mode on the basis of the driving load of the internal combustion engine 20. Specifically, the controller 200 may select the power generation mode in a case where the driving load of the internal combustion engine 20 is high and may select the heating mode in a case where the driving load of the internal combustion engine 20 is low. In a case where the driving load of the internal combustion engine 20 is high, the temperature of exhaust gas is high, and the amount of discharged exhaust gas is large. Thus, a greater amount of electric power can be efficiently generated by selecting the power generation mode. In a case where the driving load of the internal combustion engine 20 is low, it is likely that a large amount of regenerative power is generated by the power generator 50. Thus, by selecting the heating mode, regenerative power can be effectively used, and the energy efficiency of the entire vehicle or ship 1 can be improved.

For example, the controller 200 may select the mode on the basis of at least one of the position information, congestion information, surrounding image information, or driving information about the vehicle or ship 1. The position information indicates the position of the vehicle or ship 1 and can be acquired through, for example, a global positioning system (GPS). The congestion information indicates the level of vehicle or ship congestion around the vehicle or ship 1 and can be acquired from, for example, traffic information distributed using radio waves, light, or the like. The surrounding image information is images of the surroundings of the vehicle or ship 1 and can be acquired using a camera installed in or on the vehicle or ship 1. The driving information is information regarding driving of the vehicle or ship 1 and indicates, for example, a speed, a steering angle, or operation of the wiper. The driving information can be acquired using a sensor installed in or on the vehicle or ship 1.

For example, in a case where the position information indicates the position of a downward slope, it is likely that the driving load of the internal combustion engine 20 decreases, and a large amount of regenerative power is obtained, and thus the controller 200 may select the heating mode. In contrast, in a case where the position information indicates the position of an upward slope, the controller 200 may select the power generation mode. For example, in a case where the congestion information, the surrounding image information, or both the congestion information and the surrounding image information indicate congestion, it is likely that the driving load of the internal combustion engine 20 decreases, and thus the controller 200 may select the heating mode. In contrast, in a case where the congestion information, the surrounding image information, or both the congestion information and the surrounding image information do not indicate congestion, the controller 200 may select the power generation mode. For example, the controller 200 may select the heating mode in a case where the driving information indicates low speed driving and select the power generation mode in a case where the driving information indicates high speed driving.

Note that the mode selection method is not limited to the method described above. For example, the controller 200 may select the mode on the basis of the amount of electric power stored in the accumulator 30. Specifically, the controller 200 may prohibit the heating mode in a case where the amount of electric power stored in the accumulator 30 is smaller than a first threshold power amount and may allow the heating mode in a case where the amount of electric power stored in the accumulator 30 is greater than a second threshold power amount. This enables overdischarging, overcharging, or both overdischarging and overcharging of the accumulator 30 to be suppressed. Note that the first threshold power amount and the second threshold power amount may be values different from each other or equal to each other. As the first threshold power amount and the second threshold power amount, for example, the amounts of electric power predetermined empirically, experimentally, or both empirically and experimentally can be used. The controller 200 may determine one out of the power generation mode and the heating mode on the basis of the mode determined on the basis of the amounts of electric power by ignoring the mode determined on the basis of other information.

In a case where the mode selected in this case is the power generation mode (power generation mode in S102), the controller 200 closes the first valve 300 (S103). Consequently, the amount of intake air flowing into the high temperature fluid flow path 120 decreases. Electric power generated by the thermoelectric power generation unit 100 is supplied to the accumulator 30, the load 40, or both the accumulator 30 and the load 40 (S104).

In contrast, in a case where the selected mode is the heating mode (heating mode in S102), the controller 200 opens the first valve 300 (S105). Consequently, the amount of intake air flowing into the high temperature fluid flow path 120 increases. The controller 200 supplies electric power to the thermoelectric power generation unit 100 to heat the surface 110a of the thermoelectric module 110 (S106). In the heating mode, the accumulator 30 or the power generator 50 can be used as a power source.

[1.3 Effects and so Forth]

As described above, the thermoelectric power generation system 10 according to the present embodiment includes the high temperature fluid flow path 120, along which a high temperature fluid flows, the low temperature fluid flow path 130, along which a low temperature fluid flows, the thermoelectric module 110, which is arranged between the high temperature fluid flow path 120 and the low temperature fluid flow path 130, and the controller 200. The controller 200 switches between the power generation mode and the heating mode on the basis of the difference between the temperature of the high temperature fluid and the temperature of the low temperature fluid. In the power generation mode, the thermoelectric module 110 is caused to generate electric power. In the heating mode, the surface 110a of the thermoelectric module 110 is heated using the Peltier effect caused by supplying electric power to the thermoelectric module 110. The distance between the surface 110a and the high temperature fluid flow path 120 is shorter than the distance between the surface 110a and the low temperature fluid flow path 130.

As a result, the thermoelectric power generation system 10 can switch between the power generation mode and the heating mode. Thus, by heating the surface 110a of the thermoelectric module 110 in the heating mode, the thermoelectric power generation system 10 can eliminate a material adhered to the inner surface of the high temperature fluid flow path 120 with use in the power generation mode. For example, in a case where exhaust gas from the internal combustion engine 20 is used as the high temperature fluid as in the present embodiment, the thermoelectric power generation system 10 can burn and eliminate soot adhered to the inner surface of the high temperature fluid flow path 120 by heating the surface 110a of the thermoelectric module 110. As a result, the thermoelectric power generation system 10 can suppress a reduction in thermoelectric power generation efficiency that occurs with use. Furthermore, the thermoelectric power generation system 10 can heat the surface 110a of the thermoelectric module 110 by supplying electric power to the thermoelectric module 110 in the heating mode. That is, the thermoelectric power generation system 10 can cause the thermoelectric module 110 to function not only as a power generation module but also as a heating module. Thus, the thermoelectric power generation system 10 does not have to have a heater separately from the thermoelectric module 110 in order to heat the surface 110a of the thermoelectric module 110, so that the system can be simplified. The response speed of heating performed by the thermoelectric module 110 is fast, and thus the thermoelectric power generation system 10 can switch at any time between the power generation mode and the heating mode in accordance with the circumstances.

For example, in the thermoelectric power generation system 10 according to the present embodiment, the high temperature fluid may be the first gas discharged from the internal combustion engine 20, and it may be possible for the second gas having a higher oxygen concentration than the first gas to flow into the high temperature fluid flow path 120. The thermoelectric power generation system 10 may further include the first valve 300, which controls the inflow rate of the second gas into the high temperature fluid flow path 120. The controller 200 may increase the inflow rate of the second gas by controlling the first valve 300 in the heating mode in comparison with the inflow rate in the power generation mode.

As a result, in the heating mode, the oxygen concentration of fluid flowing along the high temperature fluid flow path 120 can be increased. Thus, combustion of soot adhered to the inner surface of the high temperature fluid flow path 120 can be promoted.

For example, in the thermoelectric power generation system 10 according to the present embodiment, the controller 200 may switch between the power generation mode and the heating mode on the basis of the driving load of the internal combustion engine 20.

As a result, the thermoelectric power generation system 10 can switch between the power generation mode and the heating mode in accordance with the temperature and flow rate of exhaust gas, which change on the basis of the driving load of the internal combustion engine 20. Thus, the energy efficiency of the entire vehicle or ship 1 can be improved.

For example, in the thermoelectric power generation system 10 according to the present embodiment, the controller 200 can estimate the amount of soot adhered to the inner surface of the high temperature fluid flow path 120 and change heating conditions in the heating mode in accordance with the estimated amount of soot. The amount of soot can be estimated, for example, on the basis of changes in electromotive voltage when electric power is supplied to the thermoelectric module 110. As the heating conditions, heating time and heating temperature can be taken as examples. The heating conditions can be changed such that the more the estimated amount of soot becomes, the longer the heating time is set.

As a result, the thermoelectric power generation system 10 can change the heating conditions in accordance with the amount of adhered soot, and thus adhered soot can be more assuredly burned.

For example, the thermoelectric power generation system 10 according to the present embodiment may be installed in the vehicle or ship 1 having the internal combustion engine 20, and the controller 200 may switch between the power generation mode and the heating mode on the basis of at least one of position information, congestion information, surrounding image information, or driving information about the vehicle or ship 1.

As a result, the thermoelectric power generation system 10 can switch between the power generation mode and the heating mode in accordance with the state in which the vehicle or ship 1 is in, and the energy efficiency of the entire vehicle or ship 1 can be improved.

For example, in the thermoelectric power generation system 10 according to the present embodiment, a catalyst for promoting combustion of soot in the heating mode may be applied onto the inner surface of the high temperature fluid flow path 120.

As a result, the combustion temperature of soot can be lowered, and the power consumption of the thermoelectric module 110 in the heating mode can be reduced.

For example, the thermoelectric power generation system 10 according to the present embodiment may further include the second valve 400, which controls the inflow rate of the low temperature fluid into the low temperature fluid flow path 130, and the controller 200 may control the second valve 400 in accordance with the temperature of the low temperature fluid flowing out from the low temperature fluid flow path 130.

As a result, the thermoelectric power generation system 10 can suppress changes in the temperature of the low temperature fluid and can operate the thermoelectric module 110 more stably. As a result, the thermoelectric power generation system 10 can suppress a reduction in thermoelectric power generation efficiency.

For example, in the thermoelectric power generation system 10 according to the present embodiment, the controller 200 may, in a case where the temperature of the low temperature fluid is greater than or equal to a predetermined threshold temperature, increase the inflow rate of the low temperature fluid by controlling the second valve 400.

As a result, the thermoelectric power generation system 10 can, in a case where the temperature of the low temperature fluid has increased, reduce the temperature of the low temperature fluid by increasing the flow rate of the low temperature fluid. For example, in a case where the entire thermoelectric module 110 is heated rapidly by Joule heating in the heating mode and the temperature of the low temperature fluid has increased, the controller 200 can suppress vaporization of the low temperature fluid by increasing the flow rate of the low temperature fluid. Thus, the thermoelectric power generation system 10 can stabilize the operation of the thermoelectric module 110 and can suppress a reduction in thermoelectric power generation efficiency.

A control method according to the present embodiment is a method for controlling the thermoelectric power generation system 10. The thermoelectric power generation system 10 includes the high temperature fluid flow path 120, along which a high temperature fluid flows, the low temperature fluid flow path 130, along which a low temperature fluid flows, and the thermoelectric module 110, which is arranged between the high temperature fluid flow path 120 and the low temperature fluid flow path 130. The distance between the surface 110a of the thermoelectric module 110 and the high temperature fluid flow path 120 is shorter than the distance between the surface 110a and the low temperature fluid flow path 130. The control method includes a step for causing the thermoelectric module 110 to generate electric power on the basis of the difference between the temperature of the high temperature fluid and the temperature of the low temperature fluid (S104) and a step for heating the surface 110a using the Peltier effect caused by supplying electric power to the thermoelectric module 110 (S106).

As a result, effects that are substantially the same as the above-described effects of the thermoelectric power generation system 10 can be obtained.

(Second Embodiment)

Next, a second embodiment will be described. The present embodiment mainly differs from the above-described first embodiment in that heated water is used as a high temperature fluid. In the following, the second embodiment will be described mainly about points that differ from those of the above-described first embodiment with reference to the drawings.

[2.1 Configuration of Thermoelectric Power Generation System 10A]

Figure 6:
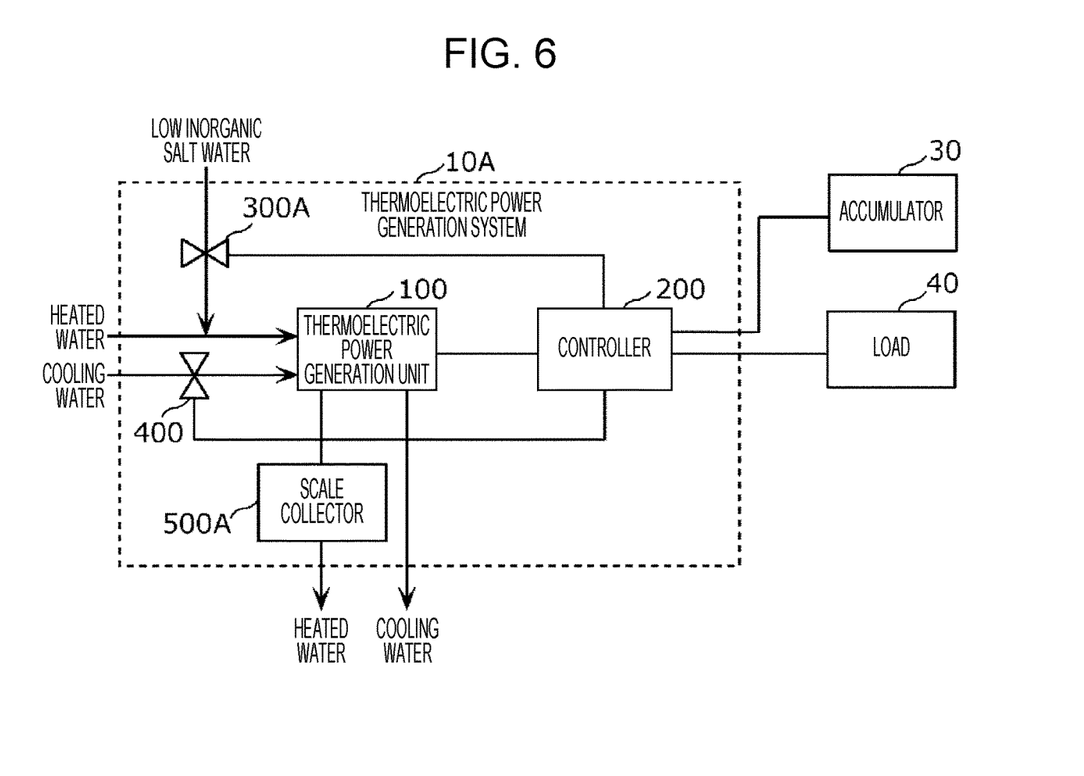
FIG. 6 is a block diagram illustrating a functional configuration of a thermoelectric power generation system according to a second embodiment.

FIG. 6 is a block diagram illustrating a functional configuration of a thermoelectric power generation system 10A according to the second embodiment. As illustrated in FIG. 6, the thermoelectric power generation system 10A according to the present embodiment includes the thermoelectric power generation unit 100, the controller 200, a first valve 300A, the second valve 400, and a scale collector 500A.

Similarly to as in the first embodiment, the thermoelectric power generation unit 100 converts a temperature difference between a high temperature fluid and a low temperature fluid into electric power. Heated water flows as the high temperature fluid into the thermoelectric power generation unit 100 and passes through the thermoelectric power generation unit 100. The low temperature fluid (for example, cooling water) flows into the thermoelectric power generation unit 100 and passes through the thermoelectric power generation unit 100.

Heated water is an example of a first liquid and includes inorganic salt. For example, ground water heated by geothermal heat can be used as heated water. In such heated water, a large amount of inorganic salt such as calcium carbonate is dissolved in an ionized state. Thus, when the temperature of the heated water decreases due to power generation of the thermoelectric power generation unit 100, inorganic salt is deposited on the inner surface of the high temperature fluid flow path 120. Hereinafter such a deposit is called scale. Scale deposited on the inner surface of the high temperature fluid flow path 120 has thermal resistance, similarly to soot in the first embodiment, thereby reducing the amount of heat transferred from the high temperature fluid to the thermoelectric module 110. As a result, the thermoelectric power generation efficiency of the thermoelectric power generation unit 100 decreases.

The controller 200 switches between the power generation mode and the heating mode similarly to as in the first embodiment. By heating the surface 110a of the thermoelectric module 110 in the heating mode, the temperature of scale and that of the high temperature fluid in the high temperature fluid flow path 120 increase, so that the scale redissolves. As a result, scale is eliminated from the inner surface of the high temperature fluid flow path 120.

The first valve 300A controls the inflow rate of low inorganic salt water into the thermoelectric power generation unit 100. Low inorganic salt water is an example of a second liquid and is a liquid having a lower inorganic salt concentration than the heated water. Consequently, redissolution of scale is promoted in the heating mode.

The scale collector 500A is connected to the high temperature fluid flow path 120 and is arranged downstream of the thermoelectric power generation unit 100. That is, the scale collector 500A is connected to a flow path for fluid flowing out from the high temperature fluid flow path 120 included in the thermoelectric power generation unit 100. In this case, "downstream of the thermoelectric power generation unit 100" may also refer to the flow path for fluid flowing out from the high temperature fluid flow path 120. The scale collector 500A forcibly makes scale be deposited by reducing the temperature of the heated water. Consequently, downstream of the thermoelectric power generation unit 100, it is possible to make scale be deposited at the scale collector 500A in a concentrated manner. Thus, scale can be efficiently collected. That is, it is possible to suppress deposition of scale at an undesired position, so that the workload for eliminating scale can be reduced.

[2.2 Effects and so Forth]

As described above, the thermoelectric power generation system 10A according to the present embodiment includes the high temperature fluid flow path 120, along which a high temperature fluid flows, the low temperature fluid flow path 130, along which a low temperature fluid flows, the thermoelectric module 110, which is arranged between the high temperature fluid flow path 120 and the low temperature fluid flow path 130, and the controller 200. The controller 200 switches between the power generation mode and the heating mode on the basis of the difference between the temperature of the high temperature fluid and the temperature of the low temperature fluid. In the power generation mode, the thermoelectric module 110 is caused to generate electric power. In the heating mode, the surface 110a of the thermoelectric module 110 is heated using the Peltier effect caused by supplying electric power to the thermoelectric module 110. The distance between the surface 110a and the high temperature fluid flow path 120 is shorter than the distance between the surface 110a and the low temperature fluid flow path 130.

As a result, the thermoelectric power generation system 10A can switch between the power generation mode and the heating mode, similarly to the thermoelectric power generation system 10 according to the first embodiment described above. Thus, by heating the surface 110a of the thermoelectric module 110 in the heating mode, the thermoelectric power generation system 10A can eliminate a material adhered to the inner surface of the high temperature fluid flow path 120 with use in the power generation mode. For example, in a case where heated water containing inorganic salt is used as the high temperature fluid as in the present embodiment, the thermoelectric power generation system 10A can dissolve and eliminate scale adhered to the inner surface of the high temperature fluid flow path 120 by heating the surface 110a of the thermoelectric module 110. As a result, the thermoelectric power generation system 10A can suppress a reduction in thermoelectric power generation efficiency that occurs with use. Furthermore, the thermoelectric power generation system 10A can heat the surface 110a of the thermoelectric module 110 by supplying electric power to the thermoelectric module 110 in the heating mode. That is, the thermoelectric power generation system 10A can cause the thermoelectric module 110 to function not only as a power generation module but also as a heating module. Thus, the thermoelectric power generation system 10A does not have to have a heater separately from the thermoelectric module 110 in order to heat the surface 110a of the thermoelectric module 110, so that the system can be simplified. The response speed of heating performed by the thermoelectric module 110 is fast, and thus the thermoelectric power generation system 10A can switch at any time between the power generation mode and the heating mode in accordance with the circumstances.

In the thermoelectric power generation system 10A according to the present embodiment, the high temperature fluid may be the first liquid, which is heated water containing inorganic salt, and it may be possible for the second liquid having a lower inorganic salt concentration than the first liquid to flow into the high temperature fluid flow path 120. The thermoelectric power generation system 10A may further include the first valve 300A, which controls the inflow rate of the second liquid into the high temperature fluid flow path 120. The controller 200 may increase the inflow rate of the second liquid by controlling the first valve 300A in the heating mode in comparison with the inflow rate in the power generation mode.

As a result, in the heating mode, the inorganic salt concentration of fluid flowing along the high temperature fluid flow path 120 can be reduced. Thus, redissolution of scale adhered to the inner surface of the high temperature fluid flow path 120 can be promoted.

The thermoelectric power generation system 10A according to the present embodiment may further include the scale collector 500A, which is connected to the high temperature fluid flow path 120 and is arranged in the flow path for fluid flowing out from the high temperature fluid flow path 120. The scale collector 500A causes inorganic salt to be deposited by reducing the temperature of the first liquid.

As a result, downstream of the thermoelectric power generation unit 100, the thermoelectric power generation system 10A can make scale be deposited at the scale collector 500A in a concentrated manner. Thus, the thermoelectric power generation system 10A can efficiently collect scale. That is, it is possible to suppress deposition of scale at an undesired position, so that the workload for eliminating scale can be reduced.

(Other Embodiments)

In the above, the thermoelectric power generation systems according to one or more aspects of the present disclosure have been described on the basis of the embodiments; however, the present disclosure is not limited to these embodiments. Forms obtained by adding various types of modification that those skilled in the art can conceive to the above-described embodiments or forms constructed by combining structural elements of the different embodiments may also be included in the scope of one or more aspects of the present disclosure without departing from the gist of the present disclosure.

For example, the thermoelectric power generation system 10 is installed in the vehicle or ship 1 in the first embodiment described above; however, the installation location is not limited thereto. For example, the thermoelectric power generation system 10 may be installed in a factory and may use, as the high temperature fluid, exhaust gas from the factory.

A thermoelectric power generation unit according to the present disclosure can be used as a power generator using heat of, for example, exhaust gas discharged from the internal combustion engine of a car or a ship or from factories or as a small portable power generator.

What is claimed is:
1. A thermoelectric power generation system comprising:
a first flow path along which a first fluid is to flow;
a second flow path along which a second fluid is to flow, a temperature of the second fluid being lower than a temperature of the first fluid;
a thermoelectric module arranged between the first flow path and the second flow path;
a primary controller programmed to switch between: (i) a power generation mode, in which the thermoelectric module is caused to generate electric power based on a difference between the temperature of the first fluid and the temperature of the second fluid; and (ii) a heating mode, in which a first surface of the thermoelectric module is heated using a Peltier effect caused by supplying electric power to the thermoelectric module; and
a first flow rate controller,
wherein:
a distance between the first surface of the thermoelectric module and the first flow path is shorter than a distance between the first surface of the thermoelectric module and the second flow path;
the first fluid is a first gas discharged from an internal combustion engine;
the first flow rate controller is programmed to control an inflow rate of a second gas into the first flow path at a position upstream of the thermoelectric module;
the second gas has a higher oxygen concentration than the first gas; and
the primary controller is programmed to increase the inflow rate of the second gas into the first flow path by controlling the first flow rate controller in the heating mode in comparison with the inflow rate of the second gas into the first flow path in the power generation mode.

2. The thermoelectric power generation system according to claim 1, wherein the primary controller is programmed to switch between the power generation mode and the heating mode based on a driving load of the internal combustion engine.

3. A vehicle comprising:
the thermoelectric power generation system according to claim 1; and
the internal combustion engine,
wherein the primary controller is programmed to switch between the power generation mode and the heating mode based on at least one of position information, congestion information, surrounding image information, or driving information about the vehicle.

4. The thermoelectric power generation system according to claim 1, further comprising:
a catalyst for promoting combustion of soot,
wherein the catalyst is on an inner surface of the first flow path.

5. A thermoelectric power generation system comprising:
a first flow path along which a first liquid is to flow;
a second flow path along which a second liquid is to flow, a temperature of the second liquid being lower than a temperature of the first liquid;
a thermoelectric module arranged between the first flow path and the second flow path;
a primary controller programmed to switch between: (i) a power generation mode, in which the thermoelectric module is caused to generate electric power based on a difference between the temperature of the first liquid and the temperature of the second liquid; and (ii) a heating mode, in which a first surface of the thermoelectric module is heated using a Peltier effect caused by supplying electric power to the thermoelectric module; and
a first flow rate controller,
wherein:
a distance between the first surface of the thermoelectric module and the first flow path is shorter than a distance between the first surface of the thermoelectric module and the second flow path;
the first liquid is heated water containing inorganic salt;
the first flow rate controller is programmed to control an inflow rate of the second liquid into the first flow path at a position upstream of the thermoelectric module;
the second liquid has a lower inorganic salt concentration than the first liquid; and
the primary controller is programmed to increase the inflow rate of the second liquid into the first flow path by controlling the first flow rate controller in the heating mode in comparison with the inflow rate of the second liquid into the first flow path in the power generation mode.

6. The thermoelectric power generation system according to claim 5, further comprising:
a collector connected to the first flow path and arranged in a third flow path for liquid flowing out from the first flow path,
wherein the collector is programmed to collect the inorganic salt by reducing the temperature of the first liquid.

7. The thermoelectric power generation system according to claim 1, further comprising:
a second flow rate controller programmed to control an inflow rate of the second gas into the second flow path,
wherein the primary controller is programmed to control the second flow rate controller based on the temperature of the second gas flowing out from the second flow path.

8. The thermoelectric power generation system according to claim 7,
wherein the primary controller is programmed to increase the inflow rate of the second gas into the second flow path by controlling the second flow rate controller in a case where the temperature of the second gas is greater than or equal to a threshold temperature.

9. A control method for the thermoelectric power generation system according to claim 1, the control method comprising:
causing the thermoelectric module to generate electric power, based on the difference between the temperature of the first fluid and the temperature of the second fluid; and
heating the first surface of the thermoelectric module using the Peltier effect caused by supplying electric power to the thermoelectric module.

10. A control method for the thermoelectric power generation system according to claim 5, the control method comprising:
causing the thermoelectric module to generate electric power, based on the difference between the temperature of the first liquid and the temperature of the second liquid; and
heating the first surface of the thermoelectric module using the Peltier effect caused by supplying electric power to the thermoelectric module.

11. A ship comprising:
the thermoelectric power generation system according to claim 1; and
the internal combustion engine,
wherein the primary controller is programmed to switch between the power generation mode and the heating mode based on at least one of position information, congestion information, surrounding image information, or driving information about the ship.

12. The thermoelectric power generation system according to claim 1,
wherein the first flow rate controller is a valve.

13. The thermoelectric power generation system according to claim 5,
wherein the first flow rate controller is a valve.

14. The thermoelectric power generation system according to claim 7,
wherein the second flow rate controller is a valve.

15. The thermoelectric power generation system according to claim 1,
wherein the first flow rate controller includes a fan or a pump.

16. The thermoelectric power generation system according to claim 5,
wherein the first flow rate controller includes a fan or a pump.

17. The thermoelectric power generation system according to claim 7,
wherein the second flow rate controller includes a fan or a pump.

18. The control method according to claim 9, further comprising:
increasing the inflow rate of the second gas into the first flow path by controlling the first flow rate controller in the heating mode in comparison with the inflow rate of the second gas into the first flow path in the power generation mode.

19. The control method according to claim 10, further comprising:
increasing the inflow rate of the second liquid into the first flow path by controlling the first flow rate controller in the heating mode in comparison with the inflow rate of the second liquid into the first flow path in the power generation mode.

* * * * *